(12) United States Patent
Che et al.

(10) Patent No.: US 12,506,134 B2
(45) Date of Patent: Dec. 23, 2025

(54) FAN-OUT PACKAGING FOR A MULTICHIP PACKAGE

(71) Applicant: Micron Technology, Inc., Boise, ID (US)

(72) Inventors: Faxing Che, Singapore (SG); Yeow Chon Ong, Toa Payoh (SG); Wei Yu, Singapore (SG); Ling Pan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 540 days.

(21) Appl. No.: 18/050,099

(22) Filed: Oct. 27, 2022

(65) Prior Publication Data

US 2024/0145457 A1 May 2, 2024

(51) Int. Cl.
| | |
|---|---|
| H01L 25/18 | (2023.01) |
| H01L 21/48 | (2006.01) |
| H01L 21/56 | (2006.01) |
| H01L 23/00 | (2006.01) |
| H01L 23/31 | (2006.01) |
| H01L 23/498 | (2006.01) |
| H01L 23/538 | (2006.01) |
| H01L 25/00 | (2006.01) |

(52) U.S. Cl.
CPC .......... *H01L 25/18* (2013.01); *H01L 21/4857* (2013.01); *H01L 21/568* (2013.01); *H01L 23/3128* (2013.01); *H01L 23/49811* (2013.01); *H01L 23/5383* (2013.01); *H01L 24/16* (2013.01); *H01L 24/32* (2013.01); *H01L 24/73* (2013.01); *H01L 25/50* (2013.01); *H01L 24/48* (2013.01); *H01L 2224/16225* (2013.01); *H01L 2224/32225* (2013.01); *H01L 2224/48147* (2013.01); *H01L 2224/48227* (2013.01); *H01L 2224/73204* (2013.01)

(58) Field of Classification Search
CPC ... H01L 25/18; H01L 21/4857; H01L 21/568; H01L 23/3128; H01L 23/49811
See application file for complete search history.

(56) References Cited

U.S. PATENT DOCUMENTS

| | | | | |
|---|---|---|---|---|
| 11,848,300 | B2 * | 12/2023 | Chang | H01L 21/563 |
| 2020/0058520 | A1 * | 2/2020 | Mao | H01L 21/6715 |
| 2020/0411478 | A1 * | 12/2020 | Chen | H01L 21/565 |
| 2023/0207526 | A1 * | 6/2023 | Huang | H01L 25/50 257/774 |
| 2024/0063047 | A1 * | 2/2024 | Wirz | H01L 21/6836 |
| 2024/0355748 | A1 * | 10/2024 | Yoo | H01L 24/81 |
| 2025/0239579 | A1 * | 7/2025 | Chang | H01L 23/49833 |

* cited by examiner

*Primary Examiner* — Thao P Le
(74) *Attorney, Agent, or Firm* — Harrity & Harrity, LLP

(57) ABSTRACT

Implementations described herein relate to various semiconductor device assemblies. In some implementations, a semiconductor device assembly may include a controller, a first mold compound surrounding the controller, a plurality of semiconductor dies, a second mold compound surrounding the plurality of semiconductor dies, and one or more through-mold interconnects electrically coupling the controller to the plurality of semiconductor dies.

24 Claims, 15 Drawing Sheets

FAN-OUT PACKAGING FOR A MULTICHIP PACKAGE

TECHNICAL FIELD

The present disclosure generally relates to semiconductor devices and methods of forming semiconductor devices. For example, the present disclosure relates to fan-out packaging for a multichip package.

BACKGROUND

A semiconductor package includes a casing that contains one or more semiconductor devices, such as integrated circuits. Semiconductor device components may be fabricated on semiconductor wafers before being diced into dies and then packaged. A semiconductor package protects internal components from damage and includes means for connecting internal components to external components (e.g., a circuit board), such as via balls, pins, or leads. A semiconductor package may include one or more semiconductor dies electrically coupled to a substrate. A semiconductor die may be electrically coupled to a substrate using wire bonding, bump bonding, or a similar bonding technique. A semiconductor package is sometimes referred to as a semiconductor device assembly.

DETAILED DESCRIPTION

Figure 1:
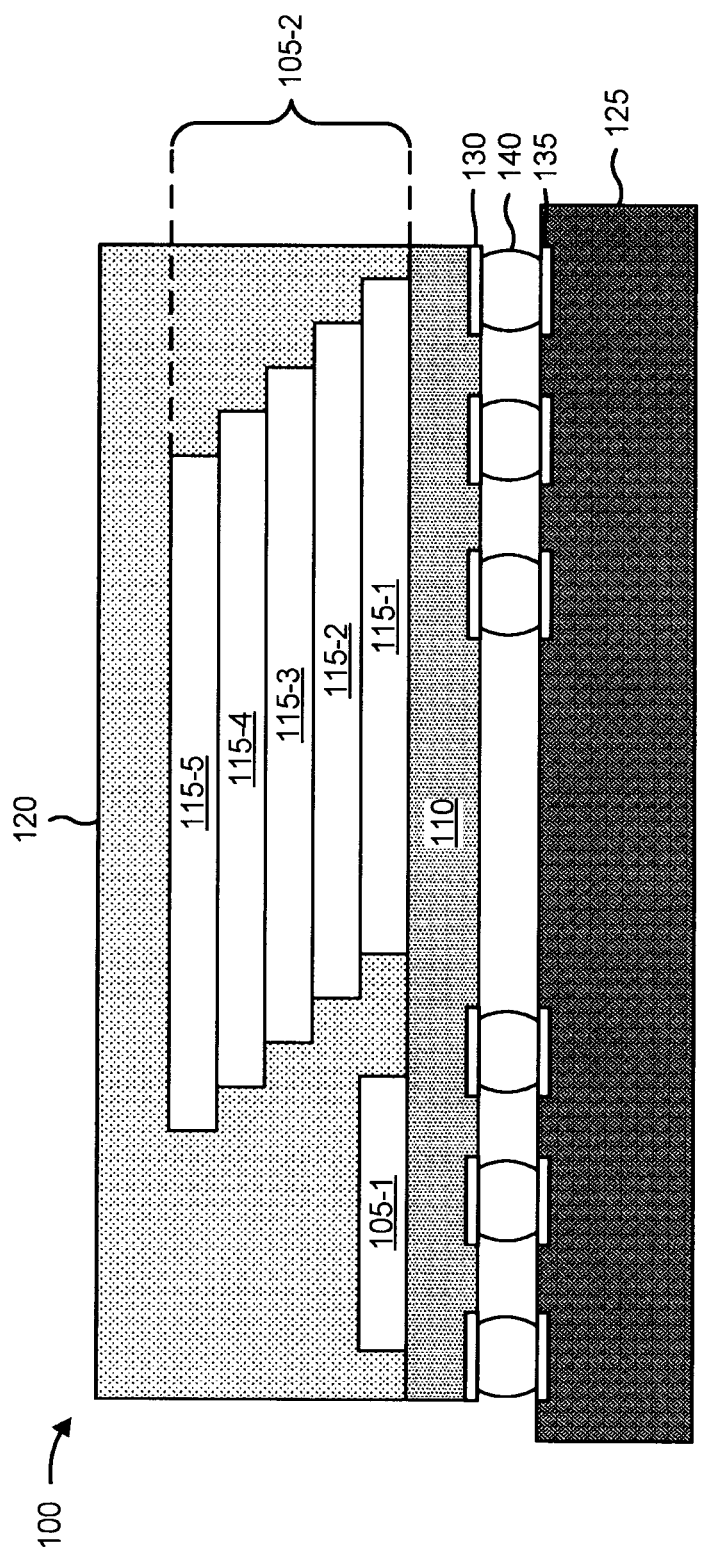
FIG. 1 is a diagram of an example apparatus that may be manufactured using techniques described herein.

Memory devices and similar components may include one or more semiconductor packages, also referred to as semiconductor device assemblies. At a high level, a semiconductor package may include one or more semiconductor devices, such as integrated circuits or similar components. A semiconductor device may include one or more semiconductor dies electrically coupled to a substrate, sometimes referred to as an organic substrate. A semiconductor die may be electrically coupled to a substrate using wire bonding, bump bonding (sometimes referred to as direct chip attachment (DCA) bonding), or a similar bonding technique.

In some examples, a memory device or a similar semiconductor device may be associated with a multichip package (MCP). An MCP may integrally include a controller (e.g., a memory controller, a microcontroller, or a similar controller) and multiple semiconductor dies (e.g., memory dies, such as NAND dies, dynamic random access memory (DRAM) dies, or similar dies). In some examples, an MCP may be an embedded multi-media controller (eMMC) MCP (eMCP), a universal flash storage (UFS) MCP (uMCP), or a similar MCP memory package. In some cases, an MCP may use an organic substrate for supporting a controller and/or memory die stacks. Use of an organic substrate may result in certain defects within the MCP, such as strip warpage, controller micro-bump misalignment during assembly, and large package warpage due to substrate shrinkage and/or coefficient of thermal expansion (CTE) mismatch between the organic substrate and a mold body. Moreover, organic substrates may not be readily available, creating challenges for high volume manufacturing (HVM) of organic-substrate-based MCPs. In some cases, handling small organic substrate strip sizes during a manufacturing process may be difficult and result in slow manufacturing speeds and relatively large input-output (I/O) pitch sizing. Furthermore, stacking various components on an organic substrate to form the MCP may result in large packages (e.g., packages with a relatively large profile and/or height). Moreover, the various components of the MCP (e.g., the controller, the memory dies, or similar components) may need to be mounted relatively far from one another to reduce thermal interaction between the various components, further increasing the size of MCPs.

Some implementations described herein enable manufacturing of MCPs using a fan-out packaging (FOP) technology in order to reduce package profile, improve package integration and throughput, reduce package defects associated with use of an organic substrate, reduce package cost due to organic-substrate elimination, or to achieve similar benefits. In some implementations, manufacturing an MCP memory package using an FOP technology may be performed on a stiff carrier at the wafer and/or panel level, thereby eliminating an organic substrate used for the MCP and thus improving manufacturing throughput and package integration. Moreover, due to elimination of the organic substrate, an FOP based MCP memory package may have a reduced height, which may result in a relatively thin profile for mobile-industry applications or other applications with tight size restrictions. Moreover, manufacturing the MCP may include a redistribution layer (RDL)-first approach, in which an RDL is first fabricated on a carrier, resulting in a finer line/space parameter as compared to a corresponding line/space parameter associated with an organic substrate. For example, in some implementations a line/space parameter of 2 micrometer (μm)/2 μm may be achieved.

In some implementations, the MCP may be manufactured using two compression molding processes, including a first compression molding process associated with controller encapsulation and a second compression molding process associated with stacked memory dies encapsulation. Different molding compounds may be used for the various compression molding processes in order to control wafer and/or panel warpage during processing as well as post-processing package warpage, thereby reducing defects in completed MCPs. In some implementations, a moldable underfill (MUF) may be used during a first molding process encapsulating the controller, which may eliminate an individual capillary underfill process for each controller, thereby further increasing manufacturing throughput. Moreover, molding compounds associated with the compression molding processes may selected to be the same molding compound or different molding compounds, thereby introducing flexibility into the manufacturing process and enabling optimization of materials used for the MCP to reduce warpage and improve package reliability.

In some implementations, an RDL and/or dielectric layer may be provided between a controller and one or more memory dies in the MCP, which may reduce thermal interaction between the various components for better thermal performance. Additionally, the RDL and/or dielectric layer may function as a buffer layer to improve solder joint reliability (SJR) under temperature cycling (TC) loading. In some implementations, eliminating an organic substrate by implementing the FOP manufacturing process for an MCP may result in cost savings as well as may eliminate strip warpage and micro-bump misalignment issues common to assembly processes associated with organic substrates. These and other benefits may be more readily understood with reference to the figures, described in detail below.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a DRAM device, a static RAM (SRAM) device, a synchronous dynamic RAM (SDRAM) device, a ferroelectric RAM (FeRAM) device, a magnetic RAM (MRAM) device, a resistive RAM (RRAM) device, a holographic RAM (HRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly. Moreover, in some examples, the apparatus 100 may be an MCP, such as an eMCP, a uMCP, or a similar MCP.

As shown in FIG. 1, the apparatus 100 may include one or more integrated circuits 105, shown as a first integrated circuit 105-1 and a second integrated circuit 105-2, disposed on a substrate 110 (e.g., an organic substrate). An integrated circuit 105 may include any type of circuit, such as an analog circuit, a digital circuit, a radiofrequency (RF) circuit, a power supply, an I/O chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
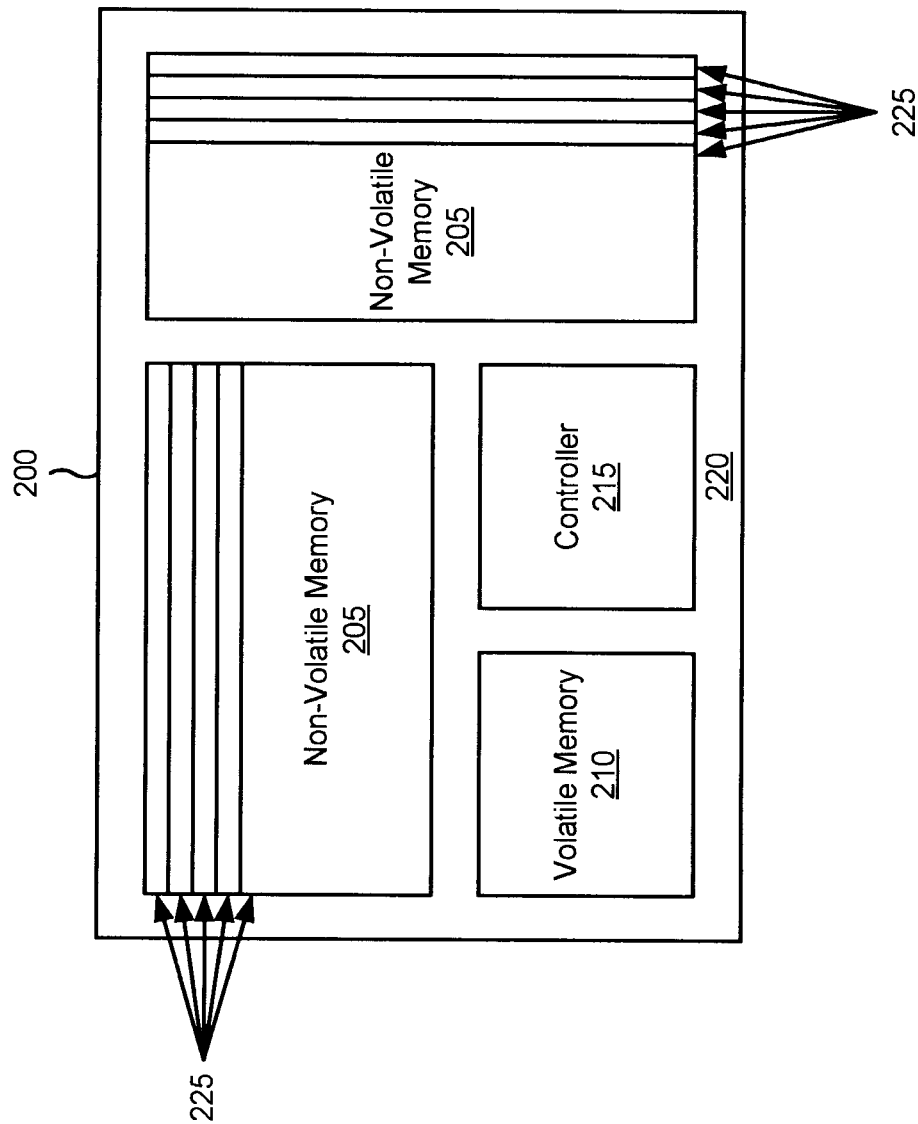
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an eMMC device. In some implementations, the memory device 200 may be an MCP memory device, such as an eMCP memory device, an uMCP memory device, or a similar MCP-based memory device.

As shown, the memory device 200 may include non-volatile memory 205, volatile memory 210, and a controller 215 (e.g., a UFS controller, an eMMC controller, or a similar controller). The components of the memory device 200 may be mounted on or otherwise disposed on a substrate 220 (e.g., an organic substrate). In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM, HRAM, SDRAM, FeRAM, MRAM, RRAM, and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
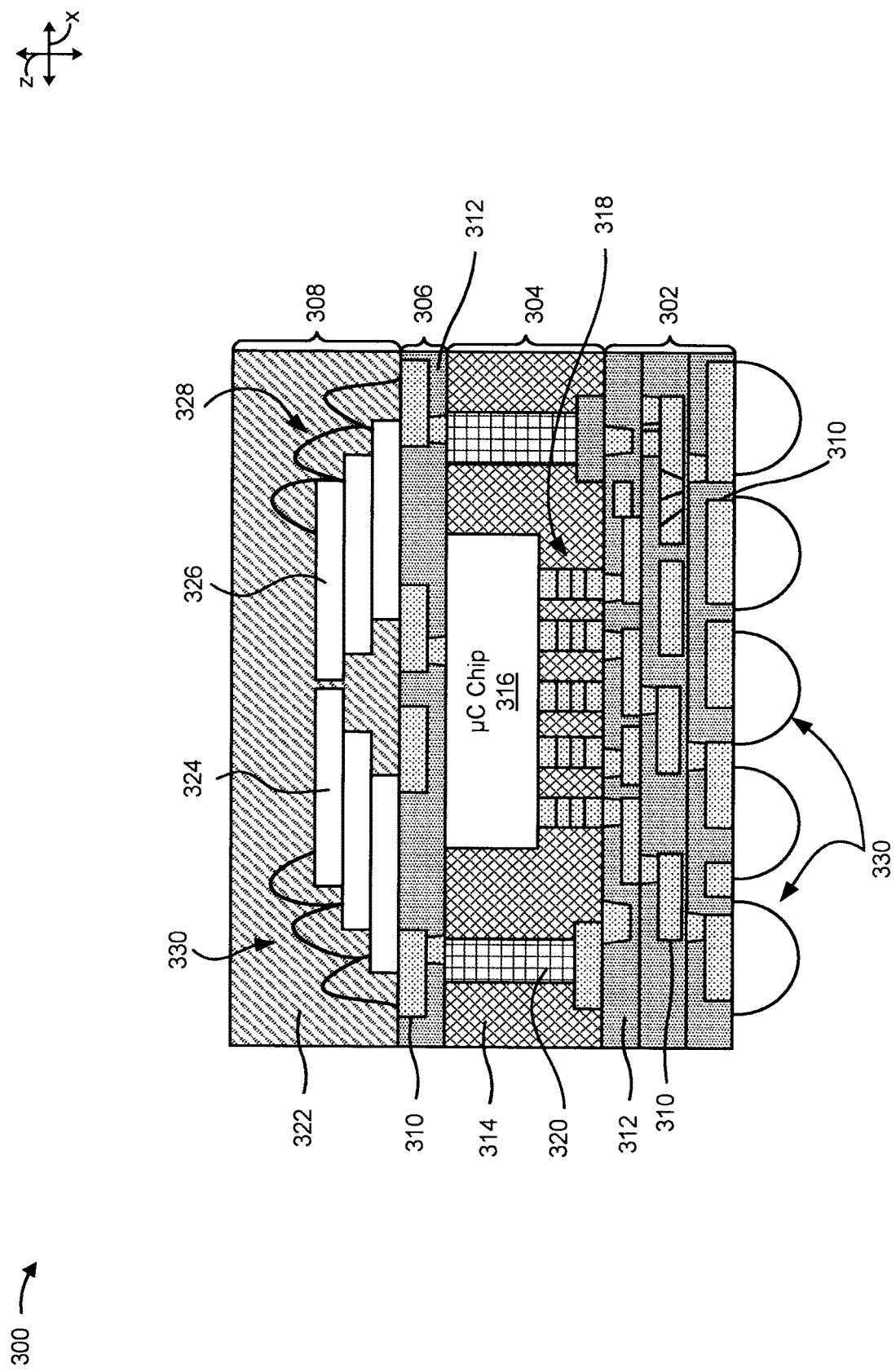
FIG. 3 is a diagram of an example apparatus manufactured using a fan-out packaging technology.

FIG. 3 is a diagram of an example apparatus 300 manufactured using an FOP technology. The apparatus 300 may include any type of device that includes one or more integrated circuits. For example, the apparatus 300 may include a memory device, a flash memory device, a NAND memory device, a NOR memory device, a RAM memory device, a ROM memory device, a DRAM device, an SRAM device, an HRAM device, an SDRAM device, an FeRAM device, an MRAM device, an RRAM device, an SSD, a microchip, and/or an SoC. In some implementations, the apparatus may be an MCP memory device or a similar MCP semiconductor device. Additionally, or alternatively, in some implementations, the apparatus 300 may be an MCP memory device or similar MCP semiconductor device manufactured using an FOP technology. "FOP" may refer to a packaging process associated with connections (e.g., I/O connections or other electrical connections) "fanned-out" from a chip surface (e.g., via an RDL), thereby enabling more external I/O connections than are provided on organic-substrate-based packages, such as the semiconductor packages described above in connection with FIGS. 1 and 2. Additionally, or alternatively, in some implementations, FOP may refer to using a mold compound (e.g., an epoxy mold compound) to fully embed one or more dies (e.g., a controller, memory dies, or similar dies) of an MCP memory device or similar semiconductor device, rather than attaching one or more dies on a substrate or an interposer. In some implementations, FOP may be referred to as a wafer-level packaging (WLP) technology.

As shown in FIG. 3, the apparatus 300 may include a set of one or more first RDLs 302, a first mold layer 304, a second set of one or more RDLs 306, and a second mold layer 308. The first set of one or more RDLs 302 and/or the second set of one or more RDLs 306 may include one or more electrical connections 310, such as copper traces, pads, or the like, used to electrically couple the RDLs to various components of the apparatus 300, and/or to electrically couple the apparatus 300 to other components (e.g., a printed circuit board (PCB) or a similar structure). In some implementations, the RDL may redistribute I/O pads for one or more components of the apparatus (e.g., a microcontroller chip) to other locations of the apparatus 300, such as for providing better access to bond pads or the like when electrically coupling the apparatus 300 to another component (e.g., a PCB). In some implementations, the first set of one or more RDLs 302 and/or the second set of one or more RDLs 306 may include a dielectric layer, such as a photo-dielectric (PD) layer 312. In implementations in which the first set of one or more RDLs 302 and/or the second set of one or more RDLs 306 include multiple RDLs, the first set of one or more RDLs 302 and/or the second set of one or more RDLs 306 may be referred to as a multilayer RDL.

The first mold layer 304 may include a first mold compound 314 surrounding a semiconductor die, such as a microcontroller (μC) chip 316 shown in FIG. 3. The microcontroller chip 316 may correspond to any of the controllers described herein, such as the controller 215, a UFS controller, an eMMC controller, or a similar controller. In that regard, the microcontroller chip 316 may be any device configured to communicate with memory dies and a host device (e.g., via a host interface). For example, the microcontroller chip 316 may include a memory controller, a system controller, an ASIC, an FPGA, a processor, a microcontroller, and/or one or more processing components. The microcontroller chip 316 may be configured to control operations of the apparatus 300, such as by executing one or more instructions (sometimes called commands). For example, the apparatus 300 may store one or more instructions as firmware, and the microcontroller chip 316 may execute those one or more instructions. Additionally, or alternatively, the microcontroller chip 316 may receive one or more instructions from a host device via a host interface, and may execute those one or more instructions. For example, the microcontroller chip 316 may transmit signals to and/or receive signals from a semiconductor die based on the one or more instructions, such as to transfer data to (e.g., write or program), to transfer data from (e.g., read), and/or to erase all or a portion of the semiconductor die. As shown in FIG. 3, the first set of one or more RDLs 302 may be disposed, in a z-axis direction, on a first side of the microcontroller chip 316, and the second set of one or more RDLs 306 may disposed, in the z-axis direction, on an opposing second side of the microcontroller chip 316.

The first mold compound 314 may be an epoxy mold compound or similar compound suitable for use in semiconductor packaging technology. In some implementations, the first mold compound 314 may be an MUF material. In that regard, the microcontroller chip 316 may include a plurality of micro-bumps 318 (e.g., solder bumps, pillar bumps, or similar bumps) used to electrically couple the microcontroller chip 316 to other components of the apparatus 300 (e.g., the first set of one or more RDLs 302) via bump bonding (e.g., DCA) or the like. In some implementations, the microcontroller chip 316 may be a flip-chip controller electrically coupled to the first set of one or more RDLs 302 via a flip-chip attachment process. The first mold compound 314 may be an MUF that surrounds the plurality of micro-bumps 318.

In some implementations, the apparatus 300 may include one or more through-mold interconnects (TMIs) 320 used to electrically couple two components of the apparatus 300 to one another, such as to electrically couple the first set of one or more RDLs 302 to the second set of one or more RDLs 306. As is described in more detail below in connection with FIG. 4D, in some implementations, the one or more TMIs 320 may be associated with a vertical wire bond, copper pillar plating, or a similar conductive structure.

The second mold layer 308 may include a second mold compound 322 surrounding one or more semiconductor dies, such as a first set of semiconductor dies 324 and a second set of semiconductor dies 326. The second mold compound 322 may be an epoxy mold compound or similar compound suitable for use in semiconductor packaging technology. The first set of semiconductor dies 324 and/or the second set of semiconductor dies 326 may be integrated circuits and/or include any type of circuit, such as an analog circuit, a digital circuit, an RF circuit, a power supply, an I/O chip, an ASIC, an FPGA, and/or a memory device (e.g., a NAND memory device, a NOR memory device, a RAM device (e.g., a DRAM device), or a ROM device). In some implementations, the first set of semiconductor dies 324 and/or the second set of semiconductor dies 326 may be a component of a memory device, such as a component of a RAM device, a ROM device, a DRAM device, an SRAM device, an SDRAM device, an FeRAM device, an MRAM device, an RRAM device, an HRAM device, a flash memory device (e.g., a NAND memory device or a NOR memory memory), and others. In some implementations, the first set of semiconductor dies 324 and/or the second set of semiconductor dies 326 may be stacked memory dies, such as stacked copies of any of the memory dies described herein. Additionally, or alternatively, in some implementations, the first set of semiconductor dies 324 may be associated with a same type of memory as the second set of semiconductor dies 326, while, in some other aspects, the first set of semiconductor dies 324 may be associated with a different type of memory than the second set of semiconductor dies 326. For example, the first set of semiconductor dies 324 may be associated with NAND (e.g., the first set of semiconductor dies 324 may be a NAND die stack), and the second set of semiconductor dies 326 may be associated with DRAM (e.g., the second set of semiconductor dies 326 may be a DRAM die stack). The individual dies of the first set of semiconductor dies 324 and/or the individual dies of the second set of semiconductor dies 326 may be electrically coupled to one another, such as via wire bonds 328 or another bonding method (e.g., one or more TSVs).

The apparatus 300 may include one or more external contacts for electrically coupling the apparatus 300 to one or more other components, such as a PCB or similar structure. For example, the apparatus 300 may include a plurality of bumps 330 (e.g., solder ball bumps) used to electrically couple the apparatus 300 to a PCB or other structure. In some implementations, the apparatus 300 may be manufactured using an FOP technology, and thus may be referred to as an FOP apparatus and/or an FOP MCP. Additional details regarding an FOP manufacturing process used to manufacture an MCP, such as the apparatus 300 shown in FIG. 3, are described below in connection with FIGS. 4A-4J.

Each of the illustrated x-axis and z-axis is substantially perpendicular to the other axis. Moreover, ay-axis, not shown, is substantially perpendicular to each of the depicted axes. In other words, the x-axis is substantially perpendicular to they-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIG. 3 is provided as an example. Other examples may differ from what is described with respect to FIG. 3.

FIGS. 4A-4J are diagrams illustrating an example of manufacturing an MCP using an FOP technology.

Figure 4A:
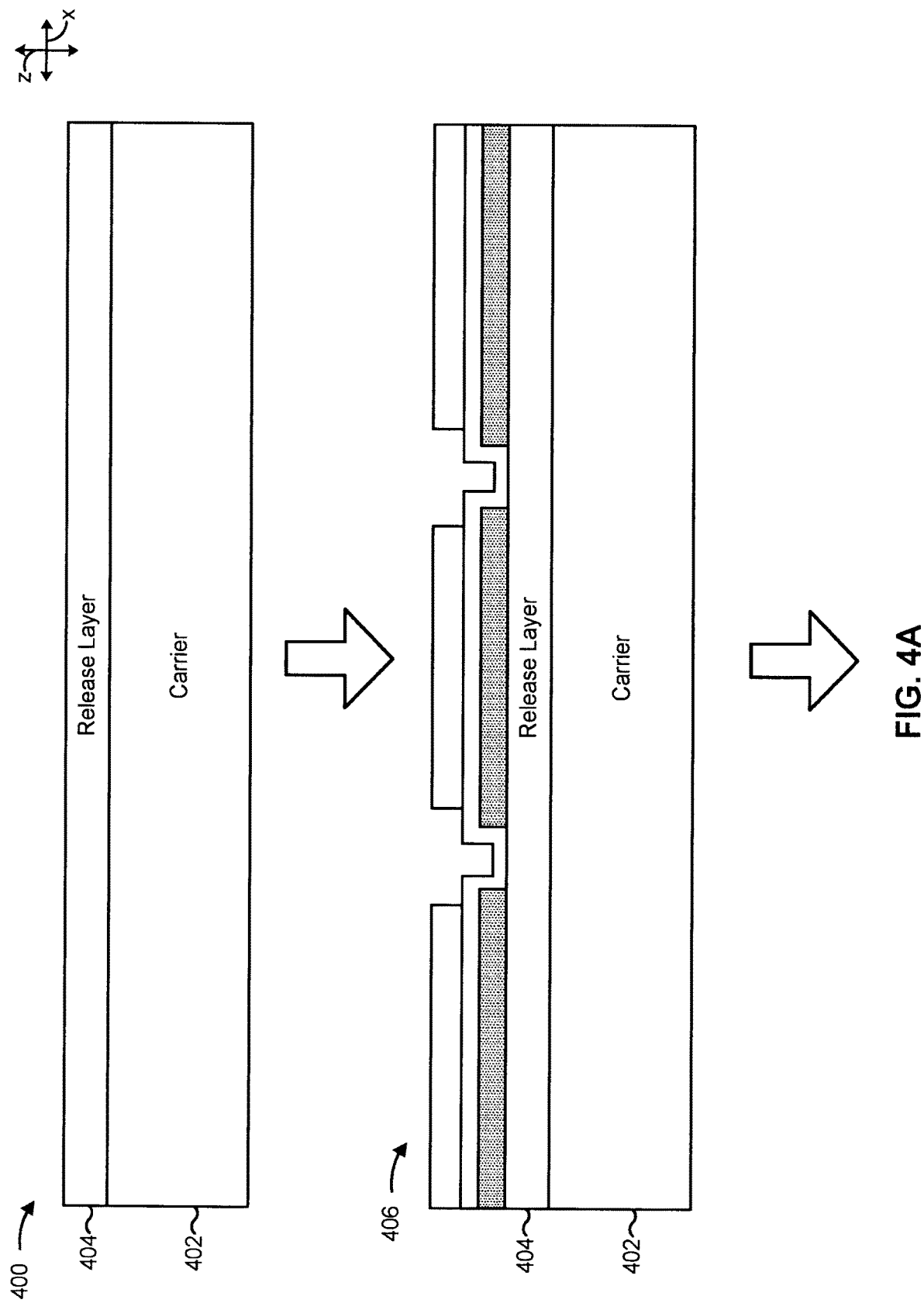
FIGS. 4A-4J are diagrams illustrating an example of manufacturing a multichip package using a fan-out packaging technology.

As shown in FIG. 4A, an MCP manufactured using an FOP technology (e.g., the apparatus 300) may be manufactured on a carrier 402. In some implementations, the carrier 402 may be a wafer-shaped carrier, a panel-shaped carrier, or a strip-shaped carrier. The carrier 402 may be constructed from any suitable material used in a semiconductor package manufacturing process. In some implementations, the carrier 402 may be a glass carrier, which may aid in a laser-debonding process, described in more detail below in connection with FIG. 4I. In some implementations, the carrier 402 may be laminated or otherwise coated with a release layer 404, sometimes referred to as a sacrificial layer. The release layer 404 may aid during a debonding process (e.g., a laser-debonding process or other debonding process) by permitting the carrier 402 to be easily removed from an MCP wafer after wafer formation, which is described in more detail below in connection with FIG. 4I.

In some implementations, the process used to manufacture the MCP may be referred to as an RDL-first FOP process, because one or more RDL layers are first built on the carrier 402 and/or the release layer 404, with the remaining components (e.g., controllers, dies, mold compounds, or similar components) then built up, in the z-axis direction, on top of the one or more RDL layers. In this regard, as indicated by reference number 406, the carrier 402 and/or the release layer 404 may be prepared for forming one or more RDLs thereon. This may include performing certain RDL preparation steps such as a polyimide patterning process, a seed layer deposition process, a photoresist coating process, or a similar preparation step.

Figure 4B:
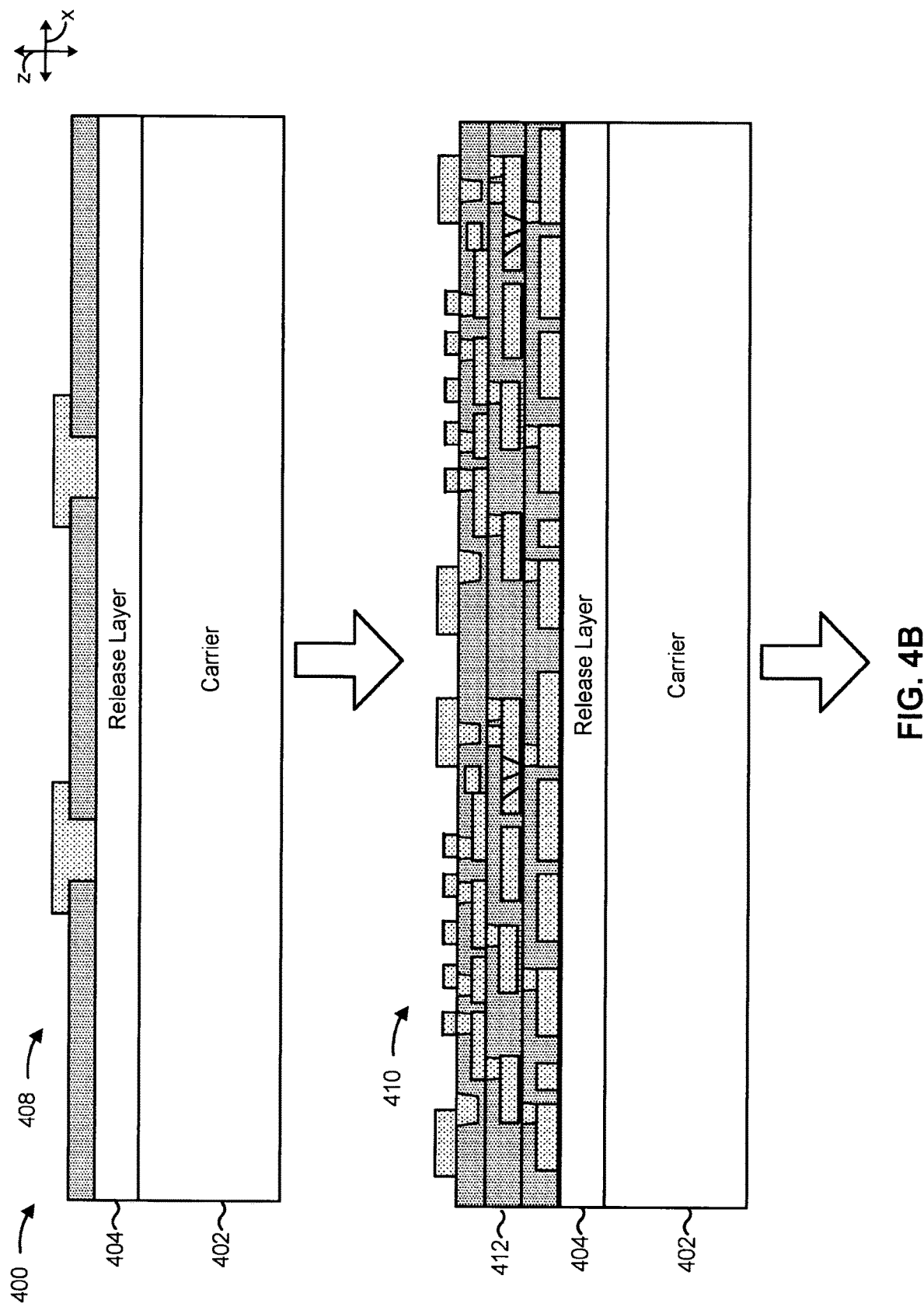

As shown in FIG. 4B, one or more RDLs (e.g., the first set of RDLs 302) may be formed on the carrier 402 and/or the release layer 404. In some aspects, electrical connections (e.g., electrical connections 310), such as signal traces, bond pads, wire-bond fingers, or similar connections may be integrally formed in the one or more RDLs for purposes of bonding the one or more RDLs to one or more other components of the MCP, for purposes of bonding the MCP to one or more external components (e.g., a PCB), and/or for purposes of conducting electricity (e.g., signals) throughout the RDLs and/or throughout the MCP. In some implementations, forming the one or more RDLs on the carrier 402 and/or the release layer 404 may include forming a metal (e.g., copper) based RDL and/or forming a metal (e.g., copper) based pad layer. More particularly, as shown by reference number 408, a first RDL layer may be formed on the carrier 402 and/or the release layer 404 via a metal (e.g., copper) plating process, a photoresist strip process, a seed layer etching process, or another similar process. As shown by reference number 410, in implementations employing multiple RDLs, the processes (e.g., the metal (e.g., copper) plating process, the photoresist strip process, the seed layer etching process, or other related process) may then be repeated multiple times to create a multilayer RDL 412 (e.g., a multilayer copper RDL).

Figure 4C:
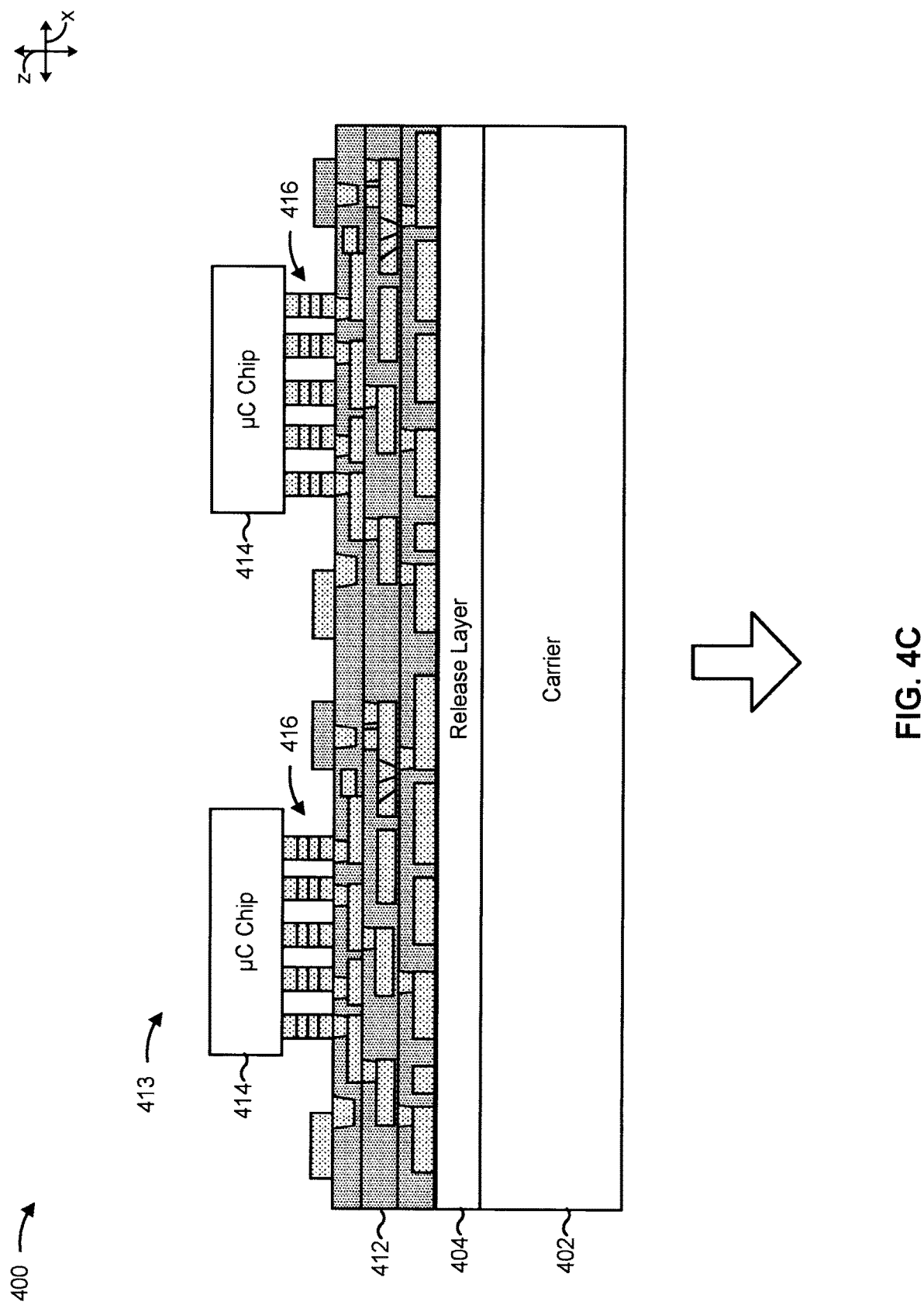

As shown by FIG. 4C, and as indicated by reference number 413, multiple controllers 414 (e.g., multiple microcontroller chips 316) may be attached and/or bonded to the multilayer RDL 412. In some implementations, the controllers 414 may be attached to the multilayer RDL 412 via multiple bump bonds 416 (e.g., micro-bumps 318). In some implementations, the bump bonds 416 may include solder bump bonds, pillar bump bonds, and/or other bump bonds. In some implementations, the controllers 414 may be flip-chip controllers manufactured with multiple bumps (e.g., solder bumps or balls, pillar bumps, or similar bumps) facing upward, in the z-axis direction, and then flipped during the chip attachment process indicated by reference number 410 such that the bumps face the multilayer RDL 412 and are bonded thereto. The multiple bump bonds 416 may be formed using a reflow process, a thermal compression bonding (TCB) process, or a similar process.

Figure 4D:
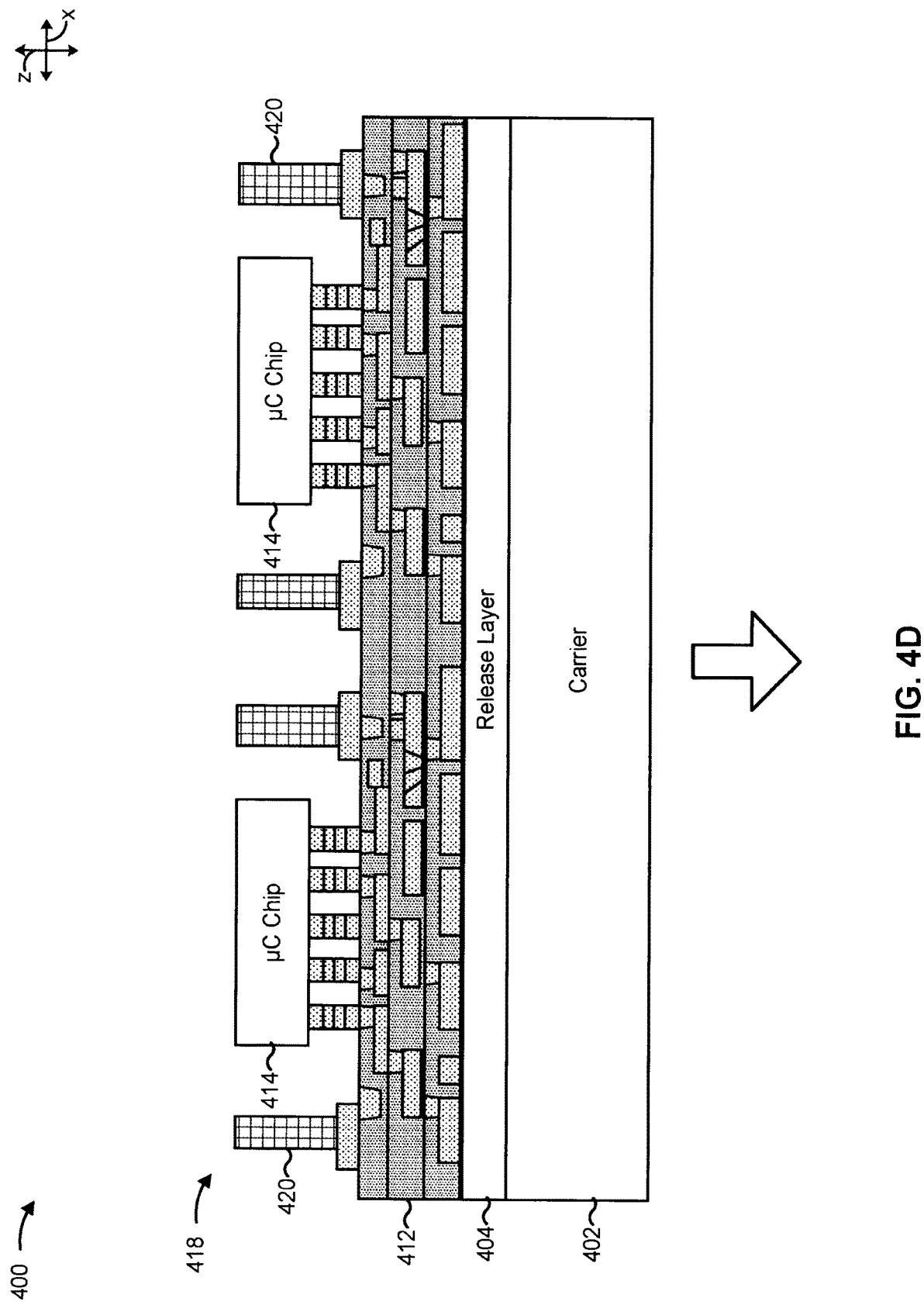

As shown by FIG. 4D, and as indicated by reference number 418, after the controllers 414 are attached and/or bonded to the multilayer RDL 412, multiple TMIs 420 (e.g., the one or more TMIs 320) may be formed on the multilayer RDL 412. In some implementations, the multiple TMIs 420 may be referred to as through-mold vias (TMVs). Each TMI 420 may be formed on a respective electrical connection (e.g., an electrical connection 310, such as a copper pad or the like), such that each TMI 420 is in communication with a respective electrical connection, the multilayer RDL 412, and/or a controller 414, and/or such that each TMI 420 may provide connectivity between one or more dies and a respective controller 414, which is described in more detail below in connection with FIG. 4G. The TMIs 420 may be formed using any suitable technology, such as by forming a vertical wire bond, using copper pillar plating, or using a similar technology.

Figure 4E:
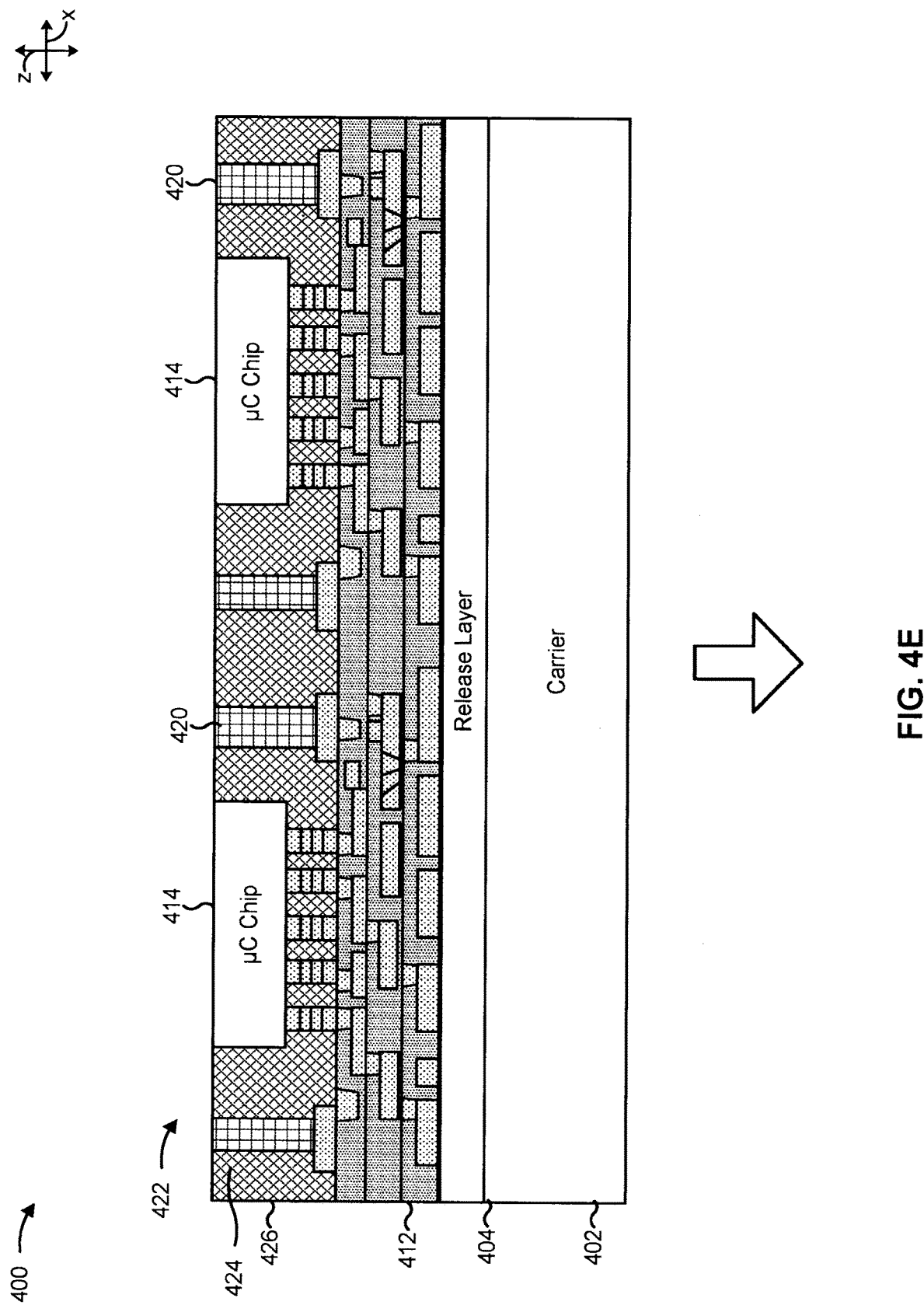

As shown in FIG. 4E, and as indicated by reference number 422, a first compression molding process (sometimes referred to as a wafer-level compression molding process and/or a panel-level compression molding process) may be performed to encapsulate the controllers 414 and/or the TMIs 420 in a first mold compound 424 (e.g., first mold compound 314), forming a first mold layer 426 (e.g., first mold layer 304). In some implementations, the first mold compound 424 may be an MUF that encapsulates the plurality of bump bonds 416 (e.g., micro-bumps 318). In some implementations, the compression molding process may result in overmolding, in which the first mold compound 424 extends higher, in the z-axis direction, than is otherwise desired for the MCP (e.g., the first mold compound 424 extends beyond upper surfaces of the controllers 414 and/or upper ends of the TMIs 420 and/or may extend beyond certain design specifications). In such aspects, additional mold processing steps may be performed, such as back-grinding, TMI revealing, or a similar process.

Figure 4F:
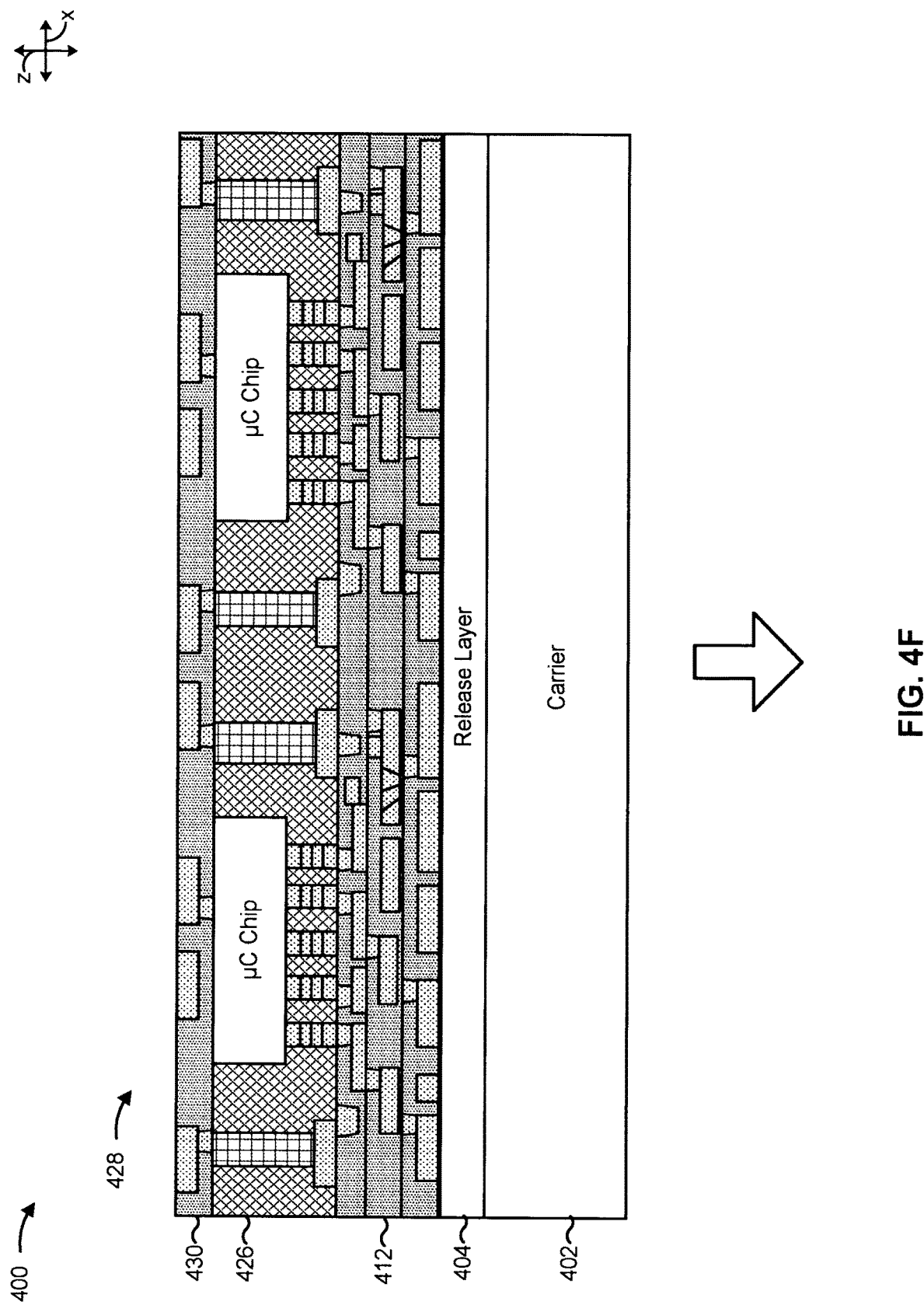

As shown by FIG. 4F, and as indicated by reference number 428, a second set of one or more RDLs may be formed on the first mold layer 426, which are sometimes referred to as one or more back side RDLs 430 (e.g., the second set of RDLs 306). In a similar manner as described above in connection with the multilayer RDL 412, forming the one or more back side RDLs 430 may include forming a metal (e.g., copper) based RDL and/or forming a metal (e.g., copper) based pad layer. For example, a first back side RDL may be formed on the first mold layer 426 using a metal (e.g., copper) plating process, a photoresist strip process, a seed layer etching process, or other similar processes. In implementations in which the one or more back side RDLs 430 is a multilayer RDL (similar to the multilayer RDL 412), the processes (e.g., the metal (e.g., copper) plating process, the photoresist strip process, the seed layer etching process, or other similar processes) may then be repeated multiple times to create a multilayer RDL (e.g., a multilayer copper RDL). In some implementations, forming the one or more back side RDLs 430 may include forming copper bond fingers used for purposes of semiconductor die (e.g., memory chip) wire bonding.

Figure 4G:
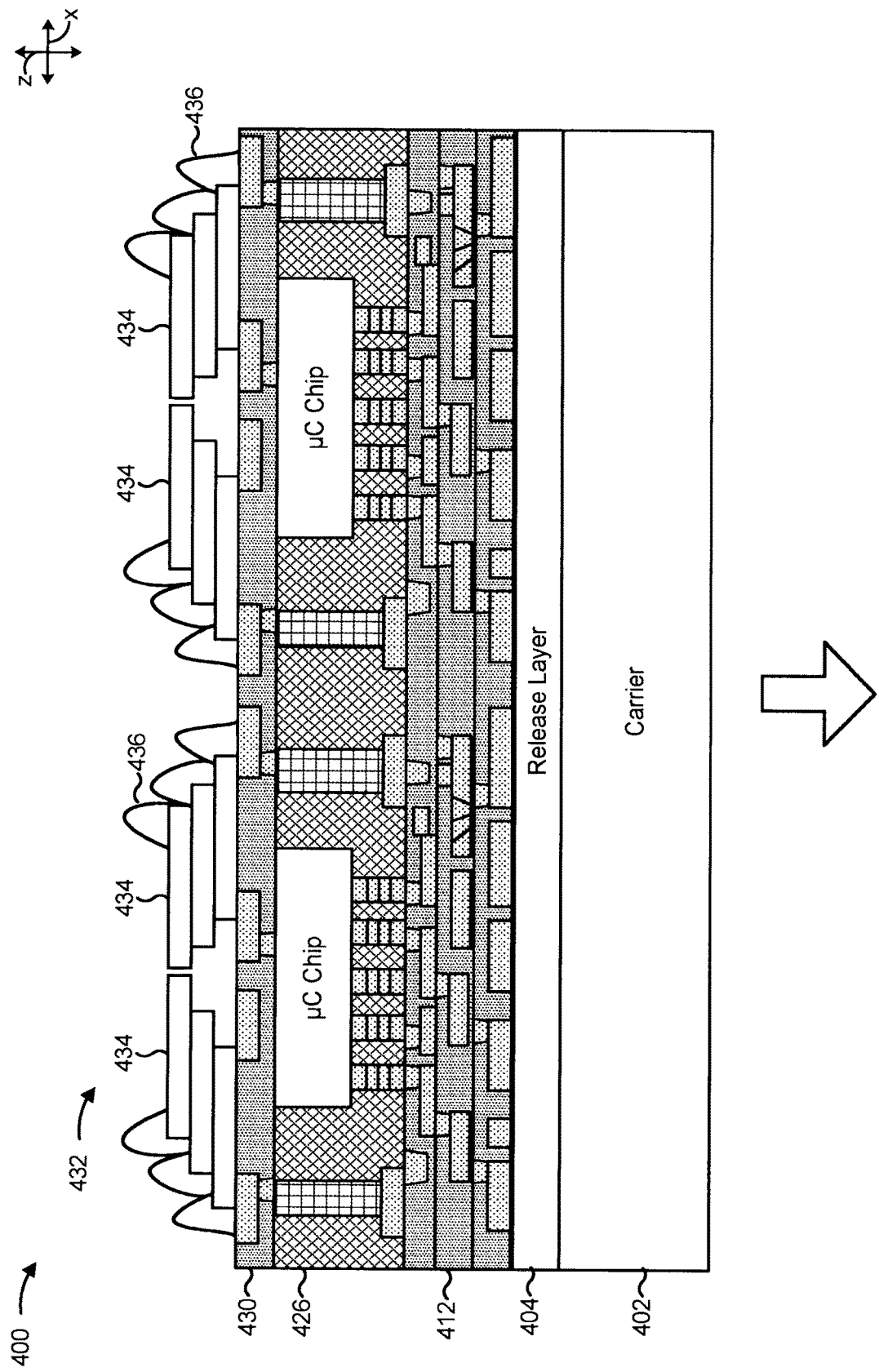

As shown by FIG. 4G, and as indicated by reference number 432, multiple semiconductor dies 434 (e.g., the first set of semiconductor dies 324 and/or the second set of semiconductor dies 326) may be attached to the one or more back side RDLs 430. In some implementations, the semiconductor dies 434 may be memory chips, such as stacked NAND and/or DRAM, as described above in connection with the first set of semiconductor dies 324 and the second set of semiconductor dies 326. In some implementations, attaching the semiconductor dies 434 to the one or more back side RDLs 430 may include attaching (e.g., with a glue, paste, tape, or similar adhesive) at least some of the semiconductor dies 434 to the one or more back side RDLs 430, stacking at least some of the semiconductor dies 434 on the one or more back side RDLs 430 and/or on each other, and/or bonding the semiconductor dies 434 to each other and/or to the one or more back side RDLs 430, such as via one or more wire bonds 436 (e.g., wire bonds 328). Although the semiconductor dies 434 are shown as stacked dies (e.g., stacked NAND and/or stacked DRAM) in FIG. 4G, in some other implementations, the semiconductor dies 434 may be disposed side-by-side on the one or more back side RDLs 430 (e.g., the one or more semiconductor dies 434 may be provided in a single layer, in the z-axis direction, on the one or more back side RDLs 430). Additionally, or alternatively, in some implementations, attaching the semiconductor dies 434 may include attaching capacitors to the semiconductor dies 434 and/or to the one or more back side RDLs 430.

Figure 4H:
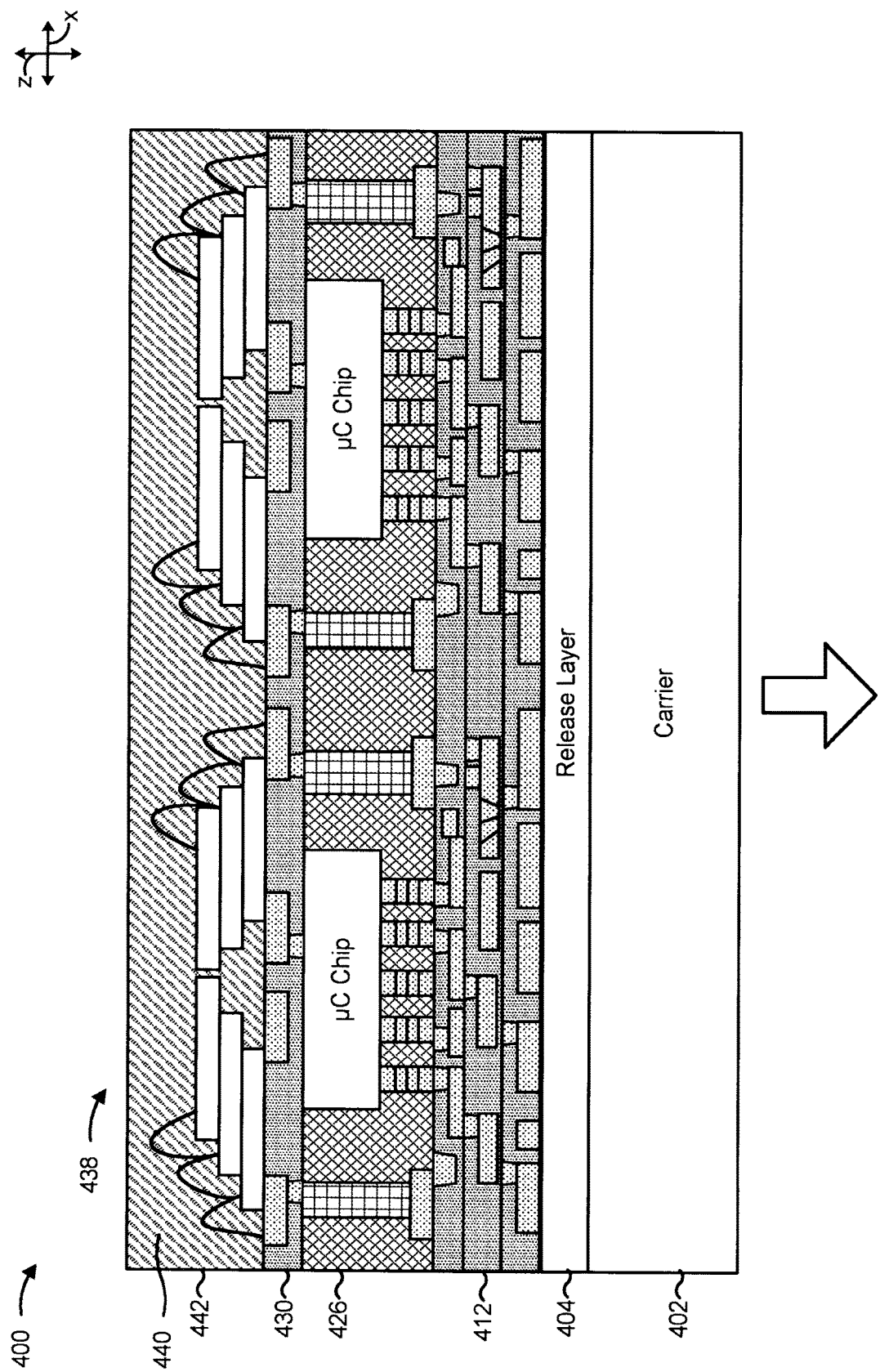

As shown in FIG. 4H, and as indicated by reference number 438, following attachment of the one or more semiconductor dies 434, a second compression molding process (sometimes referred to as a wafer-level compression molding process and/or a panel-level compression molding process) may be performed to encapsulate the one or more semiconductor dies 434 in a second mold compound 440 (e.g., second mold compound 322), forming a second mold layer 442 (e.g., second mold layer 308). In some implementations, the second mold compound 440 may be the same mold compound as the first mold compound 424 (e.g., an MUF), while, in some other implementations, the second mold compound 440 may be a different mold compound than the first mold compound 424. Moreover, in a similar manner as described above in connection with the compression molding process associated with the first mold compound 424, the second compression molding process may result in overmolding, in which the second mold compound 440 extends higher, in the z-axis direction, than is otherwise desired for the MCP (e.g., such that the second molding compound 440 extends to a dimension that exceeds a specified design thickness, or a similar dimension). In such aspects, additional mold processing steps may be performed, such as back-grinding, or a similar process.

Figure 4I:
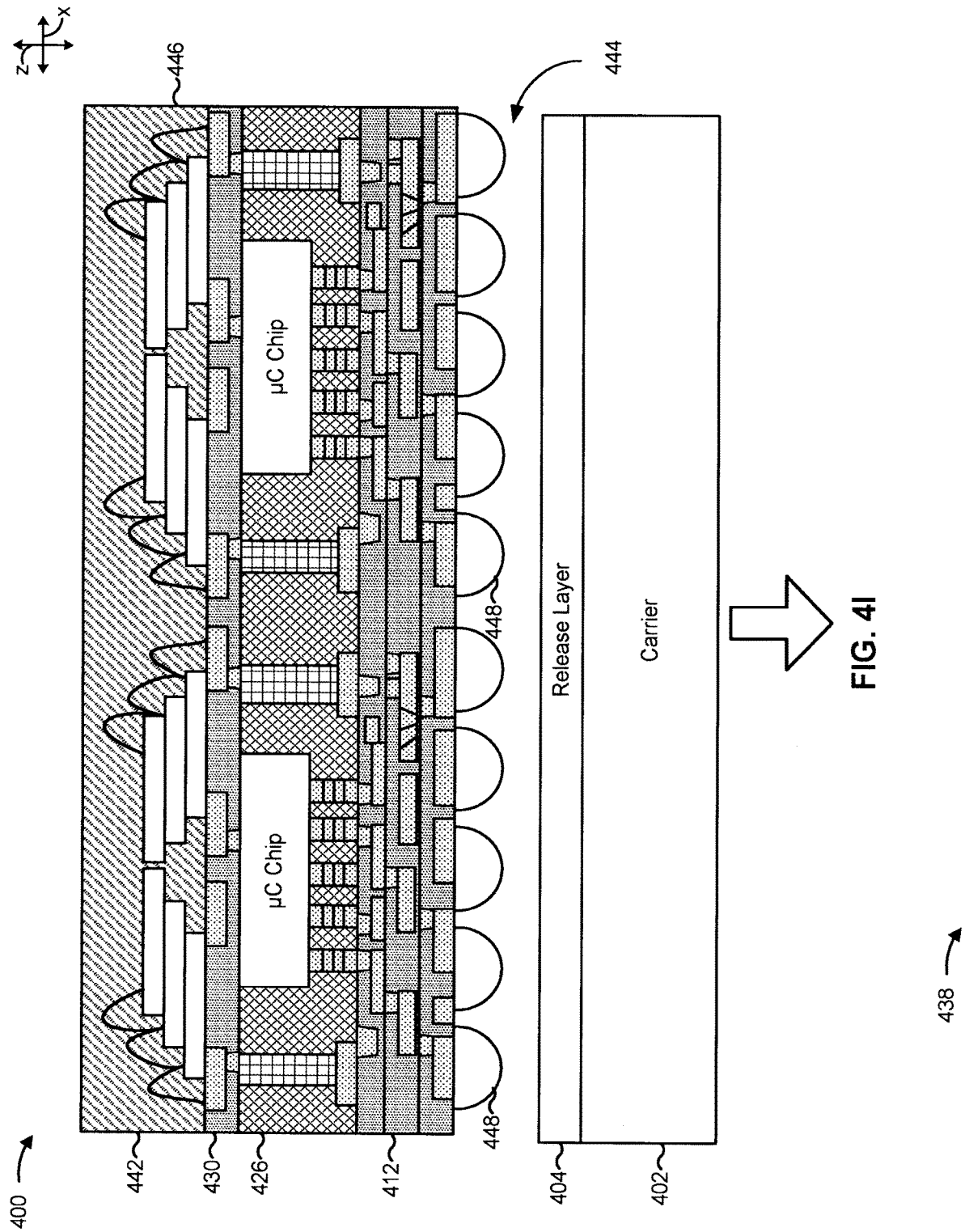

As shown by FIG. 4I, and as indicated by reference number 444, following the second compression molding process, a debonding process (sometimes referred to as a wafer-level debonding process and/or a panel-level debonding process) and/or a solder ball attach process may be performed. More particularly, the carrier 402 and/or the release layer 404 may be removed from the multilayer RDL 412, the first mold layer 426, the one or more back side RDLs 430, and the second mold layer 442, resulting in a standalone MCP wafer and/or panel 446. For example, in some implementations, the carrier 402 and/or the release layer 404 may be removed from the MCP wafer and/or panel 446 via a laser debonding process. In some implementations, removing the carrier 402 and/or the release layer 404 from the MCP wafer and/or panel 446 may include cleaning a bottom (in the z-axis direction) surface of the MCP wafer and/or panel 446 in order to remove residual adhesives, portions of the release layer 404 (e.g., portions of the sacrificial layer), or similar contaminants. Moreover, one or more solder balls 448 (e.g., bumps 330) may be soldered (e.g., attached and reflowed) to the MCP wafer and/or panel 446, which may ultimately be used to provide electrical connectivity to a PCB or similar structure. In some implementations, attaching the one or more solder balls 448 to the MCP wafer and/or panel 446 may be referred to as wafer-level and/or panel level solder ball attachment and reflow.

Figure 4J:
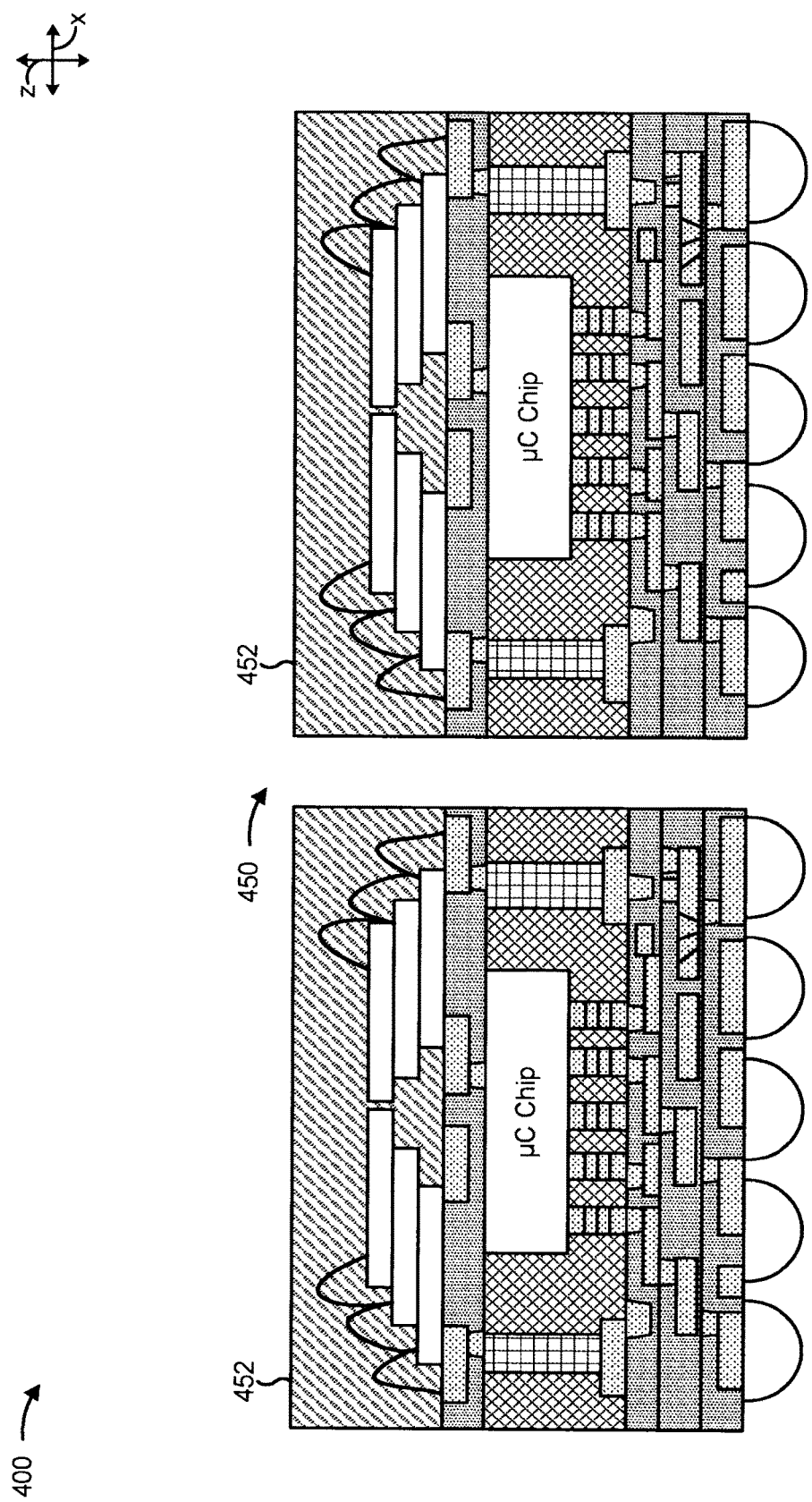

As shown by FIG. 4J, and as indicated by reference number 450, the MCP wafer and/or panel 446 may then be singulated into multiple MCPs 452 (e.g., multiple copies of the apparatus 300). Singulating the MCP wafer and/or panel 446 may include dicing the individual MCPs 452 from the MCP wafer and/or panel 446. In some implementations, dicing the individual MCPs 452 from the MCP wafer and/or panel 446 may include laminating dicing tape onto the MCP wafer and/or panel 446, dicing the plurality of MCPs 452 from the MCP wafer and/or panel 446, and/or cleaning residual dicing tape and/or other contaminants from the diced MCPs 452.

The process of manufacturing the MCPs 452 (e.g., the copies of the apparatus 300) described above in connection with FIGS. 4A-4J may provide certain benefits as compared to manufactured MCPs using a traditional semiconductor manufacturing process (e.g., a non-FOP technology). In some implementations, the MCP 452 may be associated with a reduced package thickness and/or shorter interconnection, which may provide better electrical performance. Additionally, or alternatively, the one or more back side RDLs 430 may thermally isolate the controller 414 from the semiconductor dies 434 to reduce thermal interaction for better thermal performance. The first mold compound 424 may be an MUF used to encapsulate the controller 414, which may eliminate a capillary underfill process associated with the controller 414 and thus reduce manufacturing time and improve manufacturing throughput. Moreover, using two compression molding steps, including the first compression molding step associated with the first mold compound 424 encapsulating the controller 414 and the second compression molding process associated with the second mold compound 440 encapsulating the semiconductor dies 434, may eliminate spacers that otherwise may be needed to stack dies 434 on top of controllers 414. Additionally, the one or more back side RDLs 430 provided between the controller 414 and the semiconductor dies 434 may mechanically isolate the stacked dies 434 from the controller 414, thereby reducing stress levels on the controller 414 and improving controller 414 joint reliability. Moreover, flexible selection of the two mold compounds 424, 440 may reduce panel and/or wafer warpage during a manufacturing process and/or may reduce assembled package warpage. Similarly, wafer and/or panel warpage may further be reduced during manufacturing due to a stiffness of the carrier 402 support, rather than the flexible support provided by an organic substrate.

Additionally, the RDL-first approach described above may improve SJR when subjected to board level temperature cycling due to a thicker RDL/PD layer and MUF layer as a buffer layer between die stacking and solder joints. For example, for similarly sized mold-first FOP packages and RDL-first FOP packages (e.g., 20 millimeter (mm) mold-first and RDL-first FOP packages), critical solder joints (e.g., solder joints under a die corner shadow) may exhibit a solder joint TC life of approximately 800 cycles for mold-first FOP packages and a solder joint TC life of approximately 1600 cycles for RDL-first FOP packages (e.g., the RDL-first FOP packages may exhibit an approximately 100% improvement in solder joint TC life). In some other implementations, the RDL-first FOP packages may exhibit an improvement in solder joint TC life as compared to mold-first FOP packages in the range of approximately 20% to greater than 100%. In some implementations, RDL-first FOP packages may exhibit higher TC life than mold-first FOP because of the presence of the thicker RDL and/or polymer based layer on the bottom of package, which may function as a buffer layer for the solder joint structure to reduce CTE mismatch induced stress between package and PCB exerting on solder joint. Put another way, the presence of the thicker RDL and/or polymer based layer on RDL-first FOP package (e.g., a soft polymer dielectric layer and copper pillar joint structure) may lift up and isolate a silicon chip from the solder joint. In mold-first FOP packages, on the other hand, a silicon chip may be disposed near the solder joint, which may induce higher stress on than solder joint than exhibited by RDL-first FOP packages.

As indicated above, FIGS. 4A-4J are provided as an example. Other examples may differ from what is described with regard to FIGS. 4A-4J.

Figure 5:
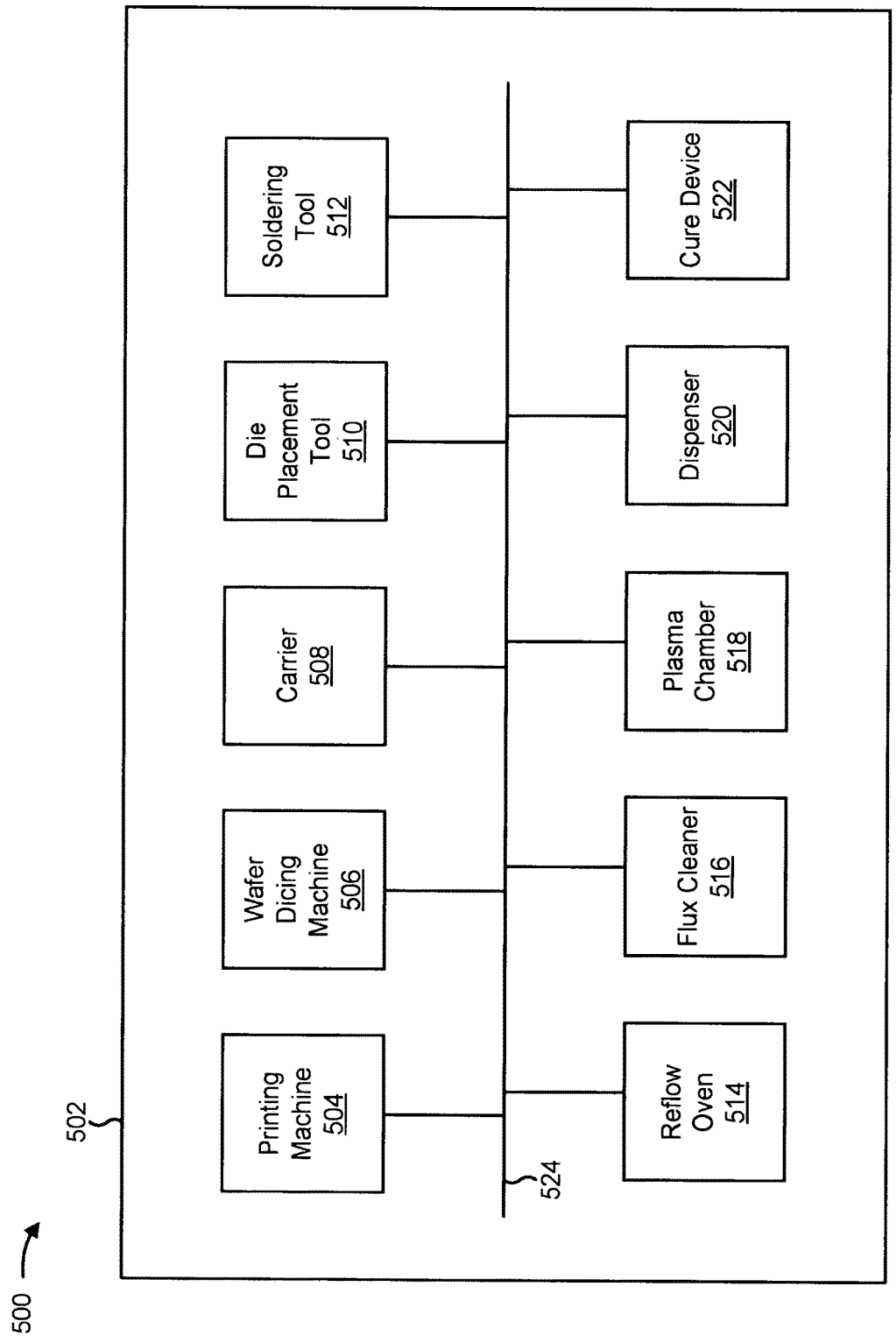
FIG. 5 is a diagram of example equipment used to manufacture various semiconductor packages, memory devices, or similar components described herein.

FIG. 5 is a diagram of example equipment 500 used to manufacture various semiconductor packages, memory devices, or similar components described herein. In some implementations, the equipment 500 may be used to manufacture an MCP memory device (e.g., apparatus 300, MCP 452) using an FOP manufacturing process, such as the FOP manufacturing process described above in connection with FIGS. 4A-4J. As shown in FIG. 5, the equipment 500 may include a packaging system 502. The packaging system 502 may include one or more devices or tooling, such as a printing machine 504, a wafer dicing machine 506, a carrier 508, a die placement tool 510, a soldering tool 512, a reflow oven 514, a flux cleaner 516, a plasma chamber 518, an dispenser 520, and/or a cure device 522. One or more devices may be may physically or communicatively coupled to one another. For example, one or more devices may interconnect via wired connections and/or wireless connections, such as via a bus 524. Additionally, or alternatively, one or more devices may form part of an electronics assembly manufacturing line.

The printing machine 504 may be a device capable of printing patterns in a material such as silicon, a dielectric material (e.g., a material used to form one or more of the dielectric interposers described above), or a similar material, for purposes of forming an integrated circuit or the like. In some implementations, the printing machine 504 may be a lithography device capable of printing patterns in a material to form an integrated circuit. Additionally, or alternatively, the printing machine 504 may be capable of applying solder or other electrically conductive material to form a portion of an electrical connection to be formed between a die and a substrate. For example, the printing machine 504 may be capable of applying a grid of solder bumps to a die, which will align with a grid of bump pads on a substrate during a flip chip attachment process, or the like.

The wafer dicing machine 506 may be a device capable of dicing a die, such as a microcontroller, a memory die, or other semiconductor die, from a wafer. In some implementations, the wafer dicing machine 506 may include one or more blades and/or one or more lasers to dice a die from the wafer.

The carrier 508 may be a device capable of supporting and/or carrying a substrate during a die and/or chip attachment process, during an FOP manufacturing process, or during a similar process. The carrier 508 may be constructed from a non-contaminating material, such as quartz, glass, or a similar material, and may be capable of withstanding high temperatures. In that regard, the carrier 508 may be capable of carrying a substrate and/or one or more die through one or more ovens, such as a reflow oven 514 and/or a cure device 522.

The die placement tool 510 may be a high-precision tool capable of placing a die onto a substrate. In some implementations, the die placement tool 512 may be capable of flipping a flip chip die during a placement process, such that an active surface of the flip chip die, which may be facing up during preliminary manufacturing steps, may face the substrate during the flip chip die placement process. In some implementations, the die placement tool 510 may include one or more sensors capable of aligning bump bonds on a die with bond pads on a substrate during a flip chip die attachment process.

The soldering tool 512 may be capable of forming one or more solder connections between components of a semiconductor package. For example, the soldering tool 512 may be capable of forming wire bond connections between components of a semiconductor package by soldering wires connecting wire bond bands from one component to wire bond pads of another component. In some implementations, the soldering tool may be capable of applying a solder mask over one or more electrical connections and/or solder joints.

The reflow oven 514 may be capable of heating components to a suitable temperature to cause a reflow of solder or other bonding material, thereby causing the solder or similar material to melt and make an electrical connection between two components.

The flux cleaner 516 may be a device capable of removing residual flux from a soldering process. In some implementations, the flux cleaner 516 may include a heater capable of removing residual flux through a heat treatment process. Additionally, or alternatively, the flux cleaner 516 may include a nozzle or similar device capable of applying a cleaning agent to a component a die attachment process in order to remove residual flux therefrom.

The plasma chamber 518 may be a device capable of providing plasma treatment to component. In some implementations, the plasma chamber 518 may be capable of directly or indirectly applying a plasma stream to an area of a component, such as for purposes of preparing the area on the component for receiving an epoxy underfill, or the like.

The dispenser 520 may be a device capable of dispensing a mold compound around a die or similar component. In some implementations, the dispenser 520 may be capable of dispensing a mold compound (e.g., an epoxy mold compound) during a compression molding process. In some implementations, the dispenser 520 may include a dispensing needle capable of applying an epoxy underfill by capillary action under pressure, such as by dispensing underfill material around a periphery of a die such that the underfill material flows beneath the die and fills a space between the die and substrate.

The cure device 522 may be a device capable of curing a mold compound, such as an epoxy mold compound, an epoxy underfill material, an MUF, or a similar material. In some implementations, the cure device 522 may be an oven configured to heat a mold compound to a suitable curing temperature. Additionally, or alternatively, the cure device 522 may be capable of curing a mold compound via a chemical reaction, by the application of ultraviolet light, by the application of other radiation, or the like.

The number and arrangement of devices and networks shown in FIG. 5 are provided as an example. In practice, there may be additional devices, fewer devices, different devices, or differently arranged devices than those shown in FIG. 5. Furthermore, two or more devices shown in FIG. 5 may be implemented within a single device, or a single device shown in FIG. 5 may be implemented as multiple, distributed devices. Additionally, or alternatively, a set of devices (e.g., one or more devices) of equipment 500 may perform one or more functions described as being performed by another set of devices of equipment 500.

Figure 6:
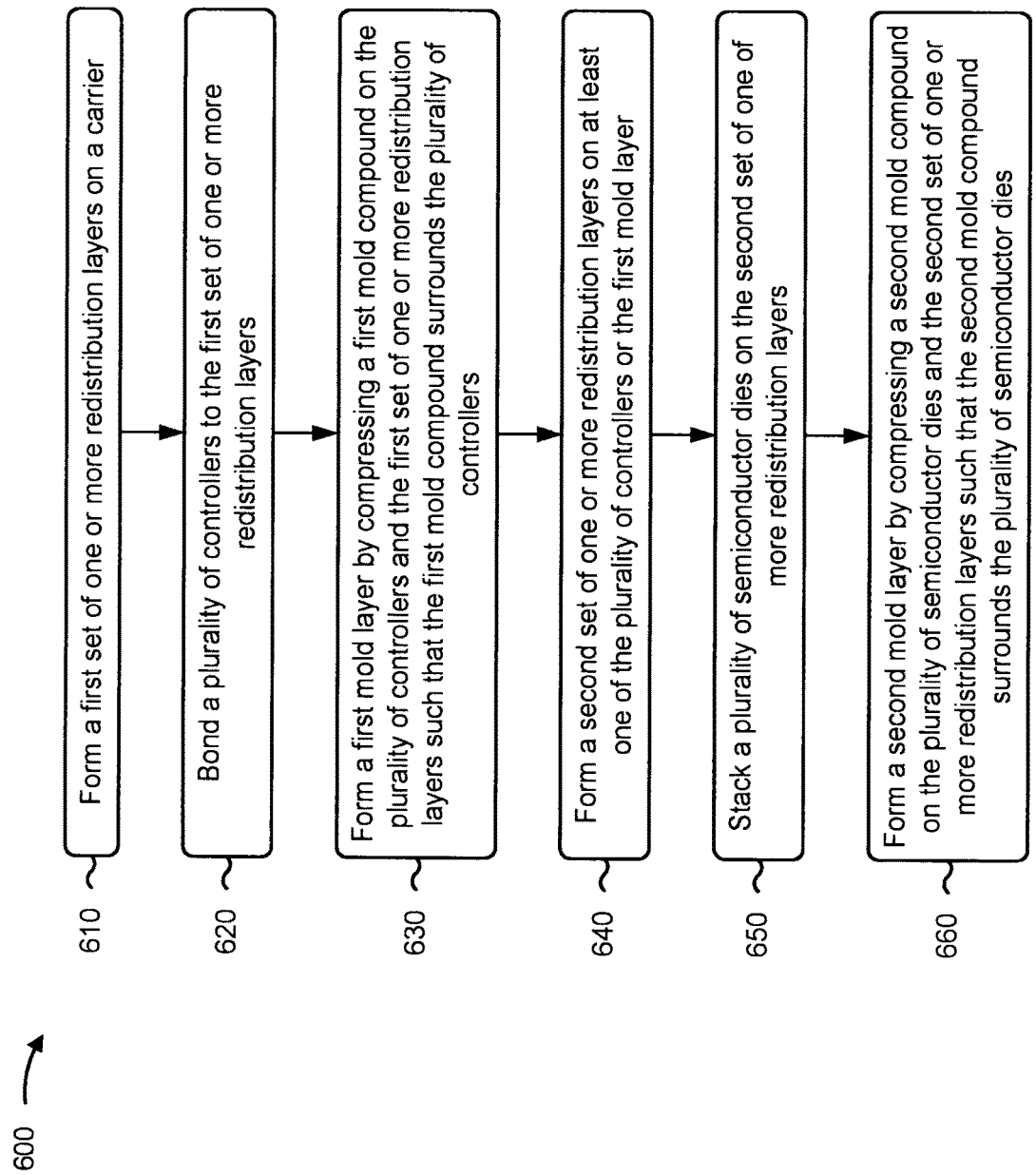
FIG. 6 is a flowchart of an example method of forming an integrated assembly or memory device having a multichip package using a fan-out packaging technology.

FIG. 6 is a flowchart of an example method 600 of forming an integrated assembly or memory device having a multichip package using a fan-out packaging technology. In some implementations, one or more process blocks of FIG. 6 may be performed by various semiconductor manufacturing equipment, such as the semiconductor manufacturing equipment described above in connection with FIG. 5.

As shown in FIG. 6, the method 600 may include forming a first set of one or more redistribution layers on a carrier (block 610). As further shown in FIG. 6, the method 600 may include bonding a plurality of controllers to the first set of one or more redistribution layers (block 620). As further shown in FIG. 6, the method 600 may include forming a first mold layer by compressing a first mold compound on the plurality of controllers and the first set of one or more redistribution layers such that the first mold compound surrounds the plurality of controllers (block 630). As further shown in FIG. 6, the method 600 may include forming a second set of one or more redistribution layers on at least one of the plurality of controllers or the first mold layer (block 640). As further shown in FIG. 6, the method 600 may include stacking a plurality of semiconductor dies on the second set of one or more redistribution layers (block 650). As further shown in FIG. 6, the method 600 may include forming a second mold layer by compressing a second mold compound on the plurality of semiconductor dies and the second set of one or more redistribution layers such that the second mold compound surrounds the plurality of semiconductor dies (block 660).

The method 600 may include additional aspects, such as any single aspect or any combination of aspects described below and/or in connection with one or more other methods described elsewhere herein.

In a first aspect, the method 600 includes forming one or more through-mold interconnects electrically coupling each controller, of the plurality of controllers, to a corresponding subset of semiconductor dies, of the plurality of semiconductor dies.

In a second aspect, alone or in combination with the first aspect, forming the one or more through-mold interconnects is performed prior to forming a first mold layer, and forming the first mold layer includes surrounding the one or more through-mold interconnects with the first mold compound.

In a third aspect, alone or in combination with one or more of the first and second aspects, forming the one or more through-mold interconnects is associated with at least one of vertical wire bonding or copper pillar plating.

In a fourth aspect, alone or in combination with one or more of the first through third aspects, forming the first set of one or more redistribution layers on the carrier includes forming the first set of one or more redistribution layers on a release layer disposed on a surface of the carrier.

In a fifth aspect, alone or in combination with one or more of the first through fourth aspects, the method 600 includes removing the carrier and the release layer, and attaching a plurality of bump bonds to the first set of one or more redistribution layers.

In a sixth aspect, alone or in combination with one or more of the first through fifth aspects, the method 600 includes singulating a multichip package from the first set of one or more redistribution layers, the first mold layer, the second set of redistribution layers, and the second mold layer, wherein the multichip package includes at least one controller, of the plurality of controllers, and a subset of semiconductor dies, of the plurality of semiconductor dies.

In a seventh aspect, alone or in combination with one or more of the first through sixth aspects, bonding the plurality of controllers to the first set of one or more redistribution layers includes performing at least one of a reflow bonding process or a thermal compression bonding process.

In an eighth aspect, alone or in combination with one or more of the first through seventh aspects, the method 600 includes forming a dielectric layer between the plurality of controllers and the plurality of semiconductor dies.

Although FIG. 6 shows example blocks of the method 600, in some implementations, the method 600 may include additional blocks, fewer blocks, different blocks, or differently arranged blocks than those depicted in FIG. 6. In some implementations, the method 600 may include forming the apparatus 300 and/or the MCP 452, an integrated assembly that includes the apparatus 300 and/or the MCP 452, any part described herein of the apparatus 300 and/or the MCP 452, and/or any part described herein of an integrated assembly that includes the apparatus 300 and/or the MCP 452. For example, the method 600 may include forming one or more of the parts associated with reference numbers 302-330, and/or reference numbers 402-452.

In some implementations, a semiconductor device assembly includes a controller; a first mold compound surrounding the controller; a plurality of semiconductor dies; a second mold compound surrounding the plurality of semiconductor dies; and one or more through-mold interconnects electrically coupling the controller to the plurality of semiconductor dies.

In some implementations, a multichip package memory device includes a microcontroller; a first mold compound surrounding the microcontroller; a plurality of stacked memory dies; a second mold compound surrounding the plurality of stacked memory dies; and one or more through-mold interconnects electrically coupling the microcontroller to the plurality of stacked memory dies.

In some implementations, a method includes forming a first set of one or more redistribution layers on a carrier; bonding a plurality of controllers to the first set of one or more redistribution layers; forming a first mold layer by compressing a first mold compound on the plurality of controllers and the first set of one or more redistribution layers such that the first mold compound surrounds the plurality of controllers; forming a second set of one or more redistribution layers on at least one of the plurality of controllers or the first mold layer; stacking a plurality of semiconductor dies on the second set of one or more redistribution layers; and forming a second mold layer by compressing a second mold compound on the plurality of semiconductor dies and the second set of one or more redistribution layers such that the second mold compound surrounds the plurality of semiconductor dies.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings. As used herein, the term "substantially" means "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:
a controller;
a first mold compound surrounding the controller;
a plurality of semiconductor dies;
a second mold compound surrounding the plurality of semiconductor dies; and
one or more through-mold interconnects electrically coupling the controller to the plurality of semiconductor dies.

2. The semiconductor device assembly of claim 1, wherein the controller includes a plurality of bump bonds, and wherein the first mold compound surrounds the plurality of bump bonds.

3. The semiconductor device assembly of claim 2, wherein the first mold compound is associated with a moldable underfill surrounding the plurality of bump bonds.

4. The semiconductor device assembly of claim 1, further comprising a plurality of redistribution layers, wherein at least a first redistribution layer, of the plurality of redistribution layers, is disposed between the controller and the plurality of semiconductor dies.

5. The semiconductor device assembly of claim 4, wherein the first redistribution layer is disposed, in a direction, on a first side of the controller, and wherein a second redistribution layer, of the plurality of redistribution layers, is disposed, in the direction, on an opposing second side of the controller.

6. The semiconductor device assembly of claim 5, further comprising a plurality of bump bonds coupled to the second redistribution layer.

7. The semiconductor device assembly of claim 1, wherein the first mold compound is a same mold compound as the second mold compound.

8. The semiconductor device assembly of claim 1, wherein the first mold compound is a different mold compound from the second mold compound.

9. A multichip package memory device, comprising:
a microcontroller;
a first mold compound surrounding the microcontroller;
a plurality of stacked memory dies;
a second mold compound surrounding the plurality of stacked memory dies; and
one or more through-mold interconnects electrically coupling the microcontroller to the plurality of stacked memory dies.

10. The multichip package memory device of claim 9, wherein the microcontroller includes a plurality of micro-bumps, and wherein the first mold compound surrounds the plurality of micro-bumps.

11. The multichip package memory device of claim 10, wherein the first mold compound is associated with a moldable underfill surrounding the plurality of micro-bumps.

12. The multichip package memory device of claim 9, further comprising a plurality of redistribution layers, wherein at least a first redistribution layer, of the plurality of redistribution layers, is disposed between the microcontroller and the plurality of stacked memory dies.

13. The multichip package memory device of claim 12, wherein the first redistribution layer is disposed, in a direction, on a first side of the microcontroller, and wherein a second redistribution layer, of the plurality of redistribution layers, is disposed, in the direction, on an opposing second side of the microcontroller.

14. The multichip package memory device of claim 13, further comprising a plurality of bump bonds coupled to the second redistribution layer.

15. The multichip package memory device of claim 9, wherein the first mold compound is a same mold compound as the second mold compound.

16. The multichip package memory device of claim 9, wherein the first mold compound is a different mold compound from the second mold compound.

17. A method, comprising:
forming a first mold compound surrounding a controller;
forming a second mold compound surrounding a plurality of semiconductor dies; and
forming one or more through-mold interconnects electrically coupling the controller to the plurality of semiconductor dies.

18. The method of claim 17, wherein the controller includes a plurality of bump bonds, and wherein the first mold compound surrounds the plurality of bump bonds.

19. The method of claim 18, wherein the first mold compound is associated with a moldable underfill surrounding the plurality of bump bonds.

20. The method of claim 17, further comprising forming a plurality of redistribution layers, wherein at least a first redistribution layer, of the plurality of redistribution layers, is disposed between the controller and the plurality of semiconductor dies.

21. The method of claim 20, wherein the first redistribution layer is disposed, in a direction, on a first side of the controller, and wherein a second redistribution layer, of the plurality of redistribution layers, is disposed, in the direction, on an opposing second side of the controller.

22. The method of claim 21, further comprising forming a plurality of bump bonds coupled to the second redistribution layer.

23. The method of claim 17, wherein the first mold compound is a same mold compound as the second mold compound.

24. The method of claim 17, wherein the first mold compound is a different mold compound from the second mold compound.

* * * * *